United States Patent
Persson

(10) Patent No.: US 7,138,863 B2
(45) Date of Patent: Nov. 21, 2006

(54) GAIN CONTROL OF A POWER AMPLIFIER

(75) Inventor: Jonas Persson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 37 days.

(21) Appl. No.: 10/480,989

(22) PCT Filed: May 2, 2002

(86) PCT No.: PCT/EP02/04827

§ 371 (c)(1),
(2), (4) Date: Mar. 17, 2004

(87) PCT Pub. No.: WO03/001662

PCT Pub. Date: Jan. 3, 2003

(65) Prior Publication Data

US 2004/0183594 A1   Sep. 23, 2004

Related U.S. Application Data

(60) Provisional application No. 60/301,909, filed on Jun. 29, 2001.

(30) Foreign Application Priority Data

Jun. 22, 2001   (GB) ................................ 0115401.2

(51) Int. Cl.
*H03G 3/20* (2006.01)
(52) U.S. Cl. .................... 330/129; 330/278; 330/285; 330/297
(58) Field of Classification Search ............... 330/127, 330/129, 285

See application file for complete search history.

(56) References Cited

U.S. PATENT DOCUMENTS

| 4,701,717 | A | 10/1987 | Radermacher et al. |
| 5,371,477 | A | 12/1994 | Ikeda et al. |
| 5,789,984 | A | 8/1998 | Davis et al. |
| 5,862,460 | A | 1/1999 | Rich |
| 5,892,397 | A | 4/1999 | Belcher et al. |
| 6,008,698 | A | 12/1999 | Dacus et al. |
| 6,047,168 | A * | 4/2000 | Carlsson et al. ............ 330/285 |
| 6,081,161 | A * | 6/2000 | Dacus et al. ................ 330/297 |
| 6,151,509 | A | 11/2000 | Chorey |
| 6,522,202 | B1 * | 2/2003 | Brandt ....................... 330/285 |
| 6,563,385 | B1 * | 5/2003 | Wojslaw ..................... 330/129 |
| 2001/0022532 | A1 | 9/2001 | Dolman |

FOREIGN PATENT DOCUMENTS

| EP | 0638994 | 2/1995 |
| EP | 0896439 | 2/1999 |
| EP | 0996224 | 4/2000 |
| WO | WO 96/07241 | 3/1996 |
| WO | WO 00/19603 | 4/2000 |

OTHER PUBLICATIONS

Global System for Mobile Communications, Digital cellular telecommunications system (Phase2+) Radio transmission and reception., GSM 05.50 Version 8.5.1 Release 1999.

* cited by examiner

*Primary Examiner*—Khanh Van Nguyen

(57) ABSTRACT

The present invention presents an improved power control scheme for RF power amplifiers. The gain control signal used to control the power amplifier is subjected to predistortion (Hpre) before being supplied to the power amplifier, in order to reduce variations in control loop gain.

13 Claims, 3 Drawing Sheets

GAIN CONTROL OF A POWER AMPLIFIER

This patent application claims the benefit of priority from U.S. Provisional Patent Application Ser. No. 60/301,909 filed on Jun. 29, 2001. This application incorporates by reference the entire disclosure of U.S. Provisional Patent Application Ser. No. 60/301,909.

The present invention relates to telecommunications systems, and in particular to power control in mobile telephone systems.

BACKGROUND OF THE INVENTION

The requirements for output power control in mobile telephones can often be difficult to achieve. The requirements for GSM, for example, can be found in the ETSI specification "05.05 *Digital cellular telecommunications system; Radio transmission and reception*". There are three critical parameters concerning the transmitter output power.

Output power level during a constant power part ("mid part") of a transmitted burst.

Power vs. time, i.e. output power during up-ramping and down-ramping parts of a transmitted burst.

Spectrum due to switching (up- and down-ramping).

Several output power classes are specified in the 05.05 document. These power levels should be kept within well-defined tolerances.

The "power vs. time" requirements state that the transmitted power should fit within a specified template, of output power versus time. The template can be illustrated as a graph of power vs. time. Adjusting the telephone parameters so that they fit the power vs. time template can be a very time-consuming task during development and critical during manufacturing.

The spectrum due to switching requirement means that the spectrum caused by the ramping (switching) process should fit in a specified spectrum mask. It is therefore necessary to have a "good" (reliable) power vs. time behaviour, not only to fulfil the power vs. time template but also to avoid spectrum contamination.

It is to be noted that, although the GSM system is used as an example, the ideas presented in this specification could be used in any TDMA (Time Division Multiple Access) system, or any system that requires fast and/or accurate power control, such as CDMA.

Arranging the power control so that the telephone fits the power vs. time template and the spectrum due to switching mask, can be a very time-consuming task. In production, good yield is necessary.

In FIG. 1 of the accompanying drawings, the principle of today's power control solution is shown. A power amplifier 1 is connected to receive an RF input $RF_{in}$. The power amplifier operates to output an amplified RF signal $RF_{out}$ to an antenna 2, as is known and understood.

In order to control the power output of the power amplifier, the current, $I_c$, used by the PA (Power Amplifier) 1, is measured (through a resistor R). This current value provides an indirect measurement of the PA output power. The measurement provided by voltage $x_4 = RI_c$, is fed back for comparison with an input control signal $x_1$ in an error detection unit 3. A difference (or error signal), $x_2$, is filtered by a loop filter, $H_{LP}$, to produce a control signal $x_3$, which is used for controlling the PA RF output power. Signal $x_3$ is often called $V_{apc}$ (apc=amplifier power control). Ideally, the measurement signal $x_4$ should track the input control signal $x_1$.

The total transfer function for the control system ($H_{tot} = x_4/x_1$) can be found from the following:

$$x_4 = x_3 H_{PA} = x_2 H_{LP} H_{PA} = (x_1 - x_4) H_{LP} H_{PA} \tag{1}$$

$$x_4(1 + H_{LP}H_{PA}) = x_1 H_{LP} H_{PA} \tag{2}$$

$$H_{tot} = \frac{x_4}{x_1} = \frac{H_{LP}H_{PA}}{1 + H_{LP}H_{PA}} \tag{3}$$

Minimizing the difference between $x_1$ and $x_4$ would provide an ideal control loop. This means that $x_4/x_1 \approx 1$, or $H_{LP}H_{PA} \gg 1$.

Ideally, the transfer function $H_{PA} = x_4/x_3$ should be constant($=I_c/V_{apc}$). However, in practice, this is not generally the case. As illustrated in FIG. 2, the transfer function of the feedback loop typically varies, i.e. the feedback loop gain varies. This variation is due to the variation of the PA transfer function $H_{PA}$ with the control voltage $V_{apc}$. Thus, the maximum achievable error reduction of the control system will vary. In the FIG. 2 example, the loop is practically "open" for low $V_{apc}$ and high $V_{apc}$ values, causing poor tracking ability in the control system. For medium $V_{apc}$ values however, the tracking ability is good, since the loop gain is high.

The non-constant behaviour of $H_{PA}$ will also result in implementation difficulties for the loop filter since the risk of instability is high. The reason for this is that the loop filter must have sufficient gain to achieve good error reduction and fast control even at low or high $V_{apc}$ values (where $H_{PA}$ is small). On the other hand, this means increased risk for instability at medium $V_{apc}$ values (where $H_{PA}$ is large).

SUMMARY OF THE PRESENT INVENTION

The invention presented in this document adds a biasing pre-distortion block to the control loop shown in FIG. 1. By doing this, the behaviour of the PA control loop will have less loop gain variation, since the gain variations of $H_{PA}$ is compensated for.

Distinguishing properties of the presented solutions are:

The power vs. time mask (in GSM specified in 05.05) should be more straightforward to fulfil, since variations in the loop gain due to variations in $H_{PA}$ are reduced. This will make implementation of suitable loop filters easier.

Since power vs. time will be easier to control, this will also mean that it is easier to do the up-ramping and down-ramping in such a way that the spectral contamination is held low. Thus, the requirements on spectrum due to switching (in GSM specified in 05.05) will be easier to fulfil.

Although the GSM system is used as an example, the ideas presented in this report could be used in any TDMA (Time Division Multiple Access) system, or any systems that require fast and/or accurate power control.

It is emphasised that the term "comprises" or "comprising" is used in this specification to specify the presence of stated features, integers, steps or components, but does not preclude the addition of one or more further features, integers, steps or components, or groups thereof.

DETAILED DESCRIPTION OF THE
PREFERRED EMBODIMENT

Figure 1:
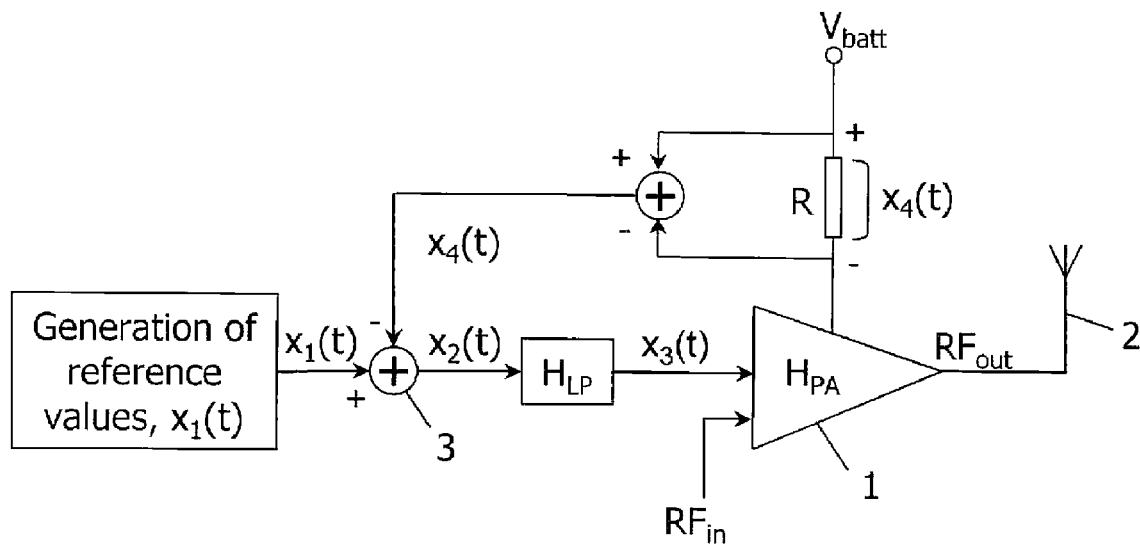
FIG. 1 illustrates a prior art power amplifier and control circuit.
Figure 2:
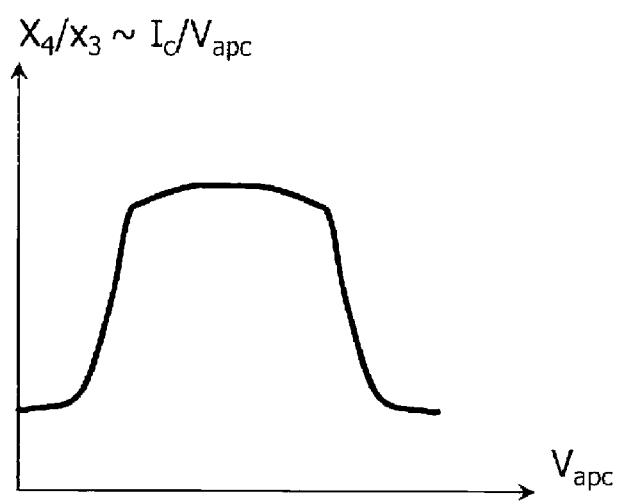
FIG. 2 illustrates a transfer function of the control circuit of FIG. 1.
Figure 3:
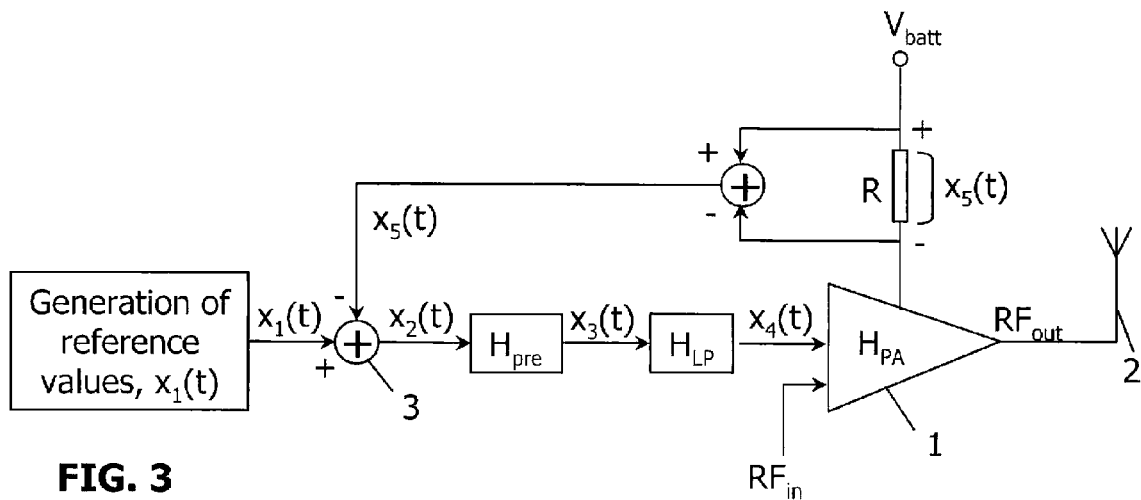
FIG. 3 illustrates a power amplifier and control circuit embodying one aspect of the present invention.

FIG. 3 is a block diagram of a power amplifier and control circuit embodying one aspect of the invention. The FIG. 3 embodiment is similar to the circuit of FIG. 1. However, the FIG. 3 circuit includes an extra functional block, $H_{pre}$, in the feedback control loop. The extra block $H_{pre}$ introduces an additional term in the transfer function of the feedback control loop. The overall transfer function of the feedback control loop can be found from the following, with reference to FIG. 3:

$$x_5 = x_4 H_{PA} \quad (4)$$
$$= x_3 H_{LP} H_{PA}$$
$$= x_2 H_{pre} H_{LP} H_{PA}$$
$$= (x_1 - x_5) H_{pre} H_{LP} H_{PA}$$

$$x_5(1+H_{pre}H_{LP}H_{PA}) = x_1 H_{pre} H_{LP} H_{PA} \quad (5)$$

Which gives:

$$H_{tot} = \frac{x_5}{x_1} = \frac{H_{pre}H_{LP}H_{PA}}{1+H_{pre}H_{LP}H_{PA}} \quad (6)$$

To produce an ideal feedback control loop, the difference between $x_1$ and $x_5$ should be minimized. This means that $x_5/x_1 \approx 1$ or in other words $H_{pre}H_{LP}H_{PA} >> 1$.

As discussed above, $H_{PA}$ is not constant. However, it is desirable to make the transfer function $H_{tot}=x_5/x_1$ constant. If the loop filter ($H_{LP}$) is assumed to be linear (i.e. the gain is independent of input signal), $H_{tot}$ can be made constant by choosing $H_{pre}=kH_{PA}^{-1}$, where k is a constant. With $H^{pre}=kH_{pa}^{-1}$ in equation (6), this gives:

$$H_{tot} = \frac{kH_{LP}}{1+kH_{LP}} \quad (7)$$

Figure 4:
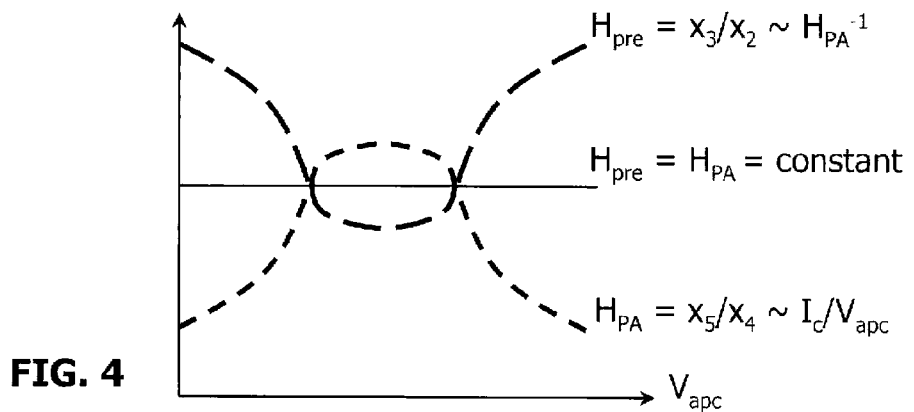
FIG. 4 illustrates respective transfer functions of parts of the circuit in FIG. 3.
Figure 5:
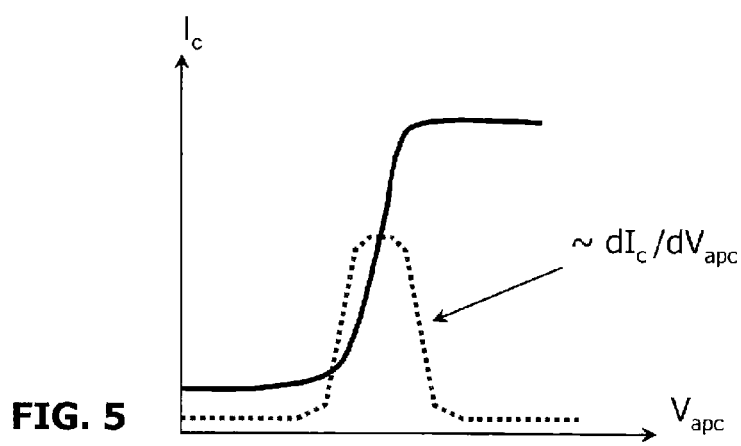
FIG. 5 illustrates a derivative of one of the transfer functions shown in FIG. 4.

In other words, by introducing a pre-distortion block, $H_{pre}=kH_{PA}^{-1}$, in the feedback control loop, the overall loop gain can be made to be constant (i.e. independent of the power amplifier $V_{apc}=x_4$). FIG. 4 illustrates such ideal pre-distortion using $H_{pre}$. In the ideal case, $H_{pre}\sim x_4/x_5$. This can be seen to mean that $H_{pre}$ is proportional to the inverse of the derivative of the function $I_c$ vs. $V_{apc}$. The function and its derivative are illustrated in FIG. 5.

Figure 6:
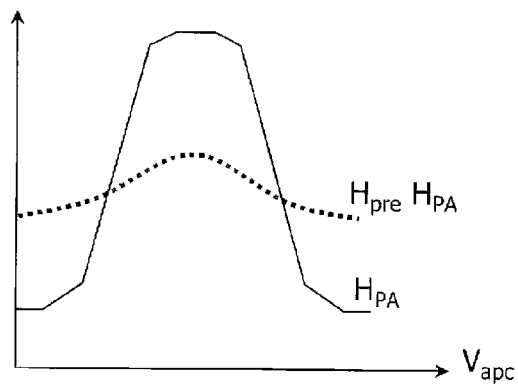
FIG. 6 illustrates control loop gain in a practical example of the circuit of FIG. 3.

However, it is not always necessary to eliminate completely variations in the loop gain by achieving perfect pre-distortion. In a solution for mobile telephones, for example, it could be acceptable to use an implementation that simply reduces the loop gain variations by a desired amount. FIG. 6 illustrates the PA transfer function ($H_{PA}$) and the resulting overall transfer function ($H_{pre}H_{PA}$) following use of the pre-distortion block in a practical embodiment.

The pre-distortion function $H_{pre}$ can be implemented or calculated in several ways.

For example, by varying the gain $H_{PA}$ of the PA 1 in real time, a circuit solution in the analogue domain can be used to determine $H_{pre}$. An analogue circuit which has $x_4$ and $x_5$ as inputs can be used to determine $H_{pre}$ such that variations in $H_{TOT}$ are reduced. The signal "gain control" in FIG. 7 sets the gain of $H_{pre}$.

Figure 7:
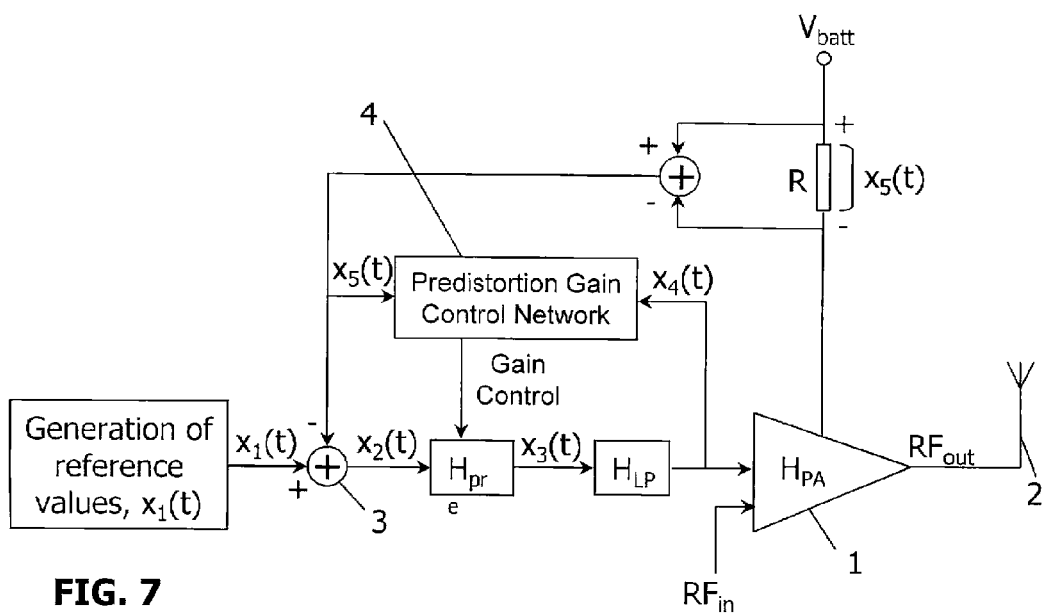
FIG. 7 illustrates a power amplifier and control circuit embodying another aspect of the present invention.

Alternatively, $H_{pre}$ can be calculated in the digital domain whilst varying the $H_{PA}$ in real time. Again, both $x_4$ and $x_5$ are used as inputs for deciding proper gain control signal to supply to the pre-distortion block. The gain control signal is calculated to minimise variations in $H_{TOT}$. As seen in FIG. 7, the predistortion gain control network 4 together with the predistortion block $H_{pre}$ form a signal processing unit/means and may be either an analog or digital signal processing unit.

Alternatively, a burst-based learning solution can be used. In such a case, the gain of the predistortion block is first set constant (=1) during one burst. Values of $x_4$ and $x_5$ are sampled (collected) during this burst. The PA characteristic, $H_{PA}$, is thereby obtained and a suitable $H_{pre}\{x_5\}$ (or $H_{pre}\{x_4\}$) is then used during the call, for all bursts that have the same nominal ("mid-part") power as the one that the $H_{pre}\{x_5\}$ (or $H_{pre}\{x_4\}$) was meant for. When a "new" power level is requested for the first time during a call, the procedure is repeated, ie. $x_4$ and $x_5$ are collected and a $H_{pre}\{x_5\}$ (or $H_{pre}\{x_4\}$) for this power level is calculated. $H_{pre}\{x_5\}$ (or $H_{pre}\{x_4\}$) for different power levels are stored in a memory (table). When the $H_{pre}\{x_5\}$ (or $H_{pre}\{x_4\}$) is to be used, first the memory address containing the table is addressed to find the data $H_{pre}\{x_5\}$ (or $H_{pre}\{x_4\}$) associated with the power level that is to be sent. Then, during transmission of the burst, the elements in the table (on the memory address) are addressed with $x_5$ (or $x_4$).

As an alternative $x_1$ could be used to address the elements in a table containing $H_{pre}\{x_1\}$ The learning principle is the same as above, with the exception that not only values of $x_4$ and $x_5$ are sampled (collected) during the burst but also $x_1$.

As a further alternative, a learning procedure can be used during manufacture of the device concerned (telephone, for example). Tables, addressed with $x_4$ and/or $x_5$, are used for deciding proper gain in the pre-distortion block. For each power level (and with $H_{pre}$=constant=1), values of $x_4$ and $x_5$ are sampled (collected). Thus, the PA characteristic, $H_{PA}$, is obtained and a suitable $H_{pre}\{x_5\}$ (or $H_{pre}\{x_4\}$) for each power level can be computed. $H_{pre}\{x_5\}$ (or $H_{pre}\{x_4\}$) for different power levels are stored in a memory (table). When the $H_{pre}\{x_5\}$ (or $H_{pre}\{x_4\}$) is to be used, first the memory address containing the table is addressed to find the data $H_{pre}\{x_5\}$ (or $H_{pre}\{x_4\}$) associated with the power level that is to be sent. Then, during transmission of the burst, the elements in the table (on this memory address) are address with $x_5$ (or $x_4$).

As an alternative, $x_1$ could be used to address the elements in a table containing $H_{pre}\{x_1\}$. The "learn-up" principle is the same as described above, with the exception that not only values of $x_5$ and $x_5$ are sampled (collected) during the burst, but also $x_1$.

The learning procedure can also be used to produce tables for reference during use. The gain $H_{pre}$ in the pre-distortion block then depends on what power level the telephone is requested to transmit on during the "mid part" of the burst.

FIG. 7 shows the principle of using the real time or burst variation of the $H_{pre}$, to reduce loop gain variations due to gain variations in $H_{PA}$.

Figure 8:
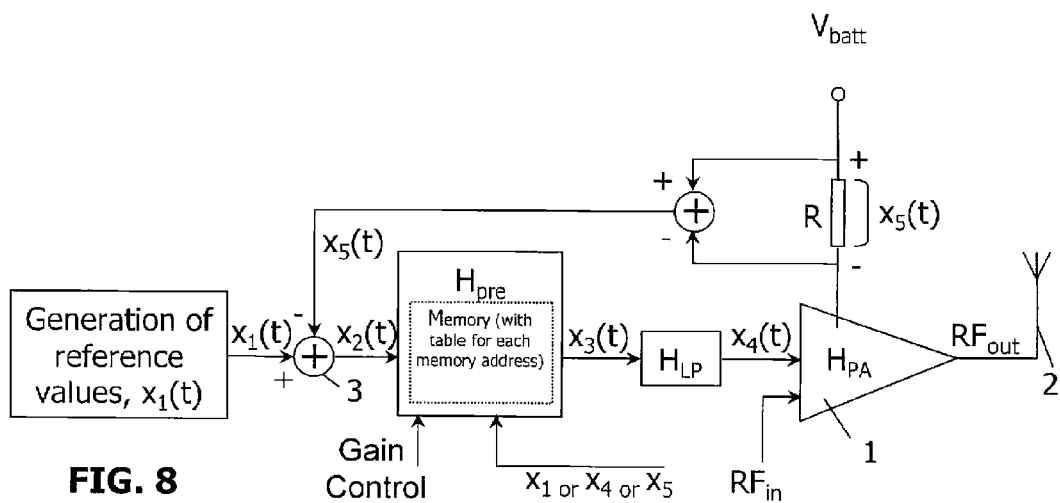
FIG. 8 illustrates a power amplifier and control circuit embodying another aspect of the present invention.

In FIG. 8, the principles of using the tabular methods are illustrated. The gain of $H_{pre}$ is varied in a manner that has been determined by the learning procedure described above. The memory is associated with the $H_{pre}$ block. The gain control points to a particular memory address and each memory address is associated with a table. Specifically, x1 or x4 or x5 points to a element of that particular table. In other words, there are tables associated with the memory address, which in turn is associated with the memory.

Reducing variations in feedback loop gain means that the power vs. time mask in TDMA systems (in GSM this is specified in the 05.05 ETSI document) will probably be easier to fulfil. This will make implementation of suitable loop (filter) easier.

Since power vs. time will be easier to control, up-ramping and down-ramping will be possible in such a way that the spectral contamination remains low. Thus, the requirements on spectrum due to switching (in GSM this is specified in the 05.05 ETSI document) will probably be easier to fulfil.

The invention claimed is:

1. A power amplifier circuit comprising:
a power amplifier having a control input, a signal input and a signal output, the amplifier having a gain value determined by a control signal applied to the control input of the power amplifier;
a measurement unit operable to produce a measurement signal indicative of an amount of electrical current drawn by the power amplifier; and
a control unit comprising:
an error detection unit operable to receive the measurement signal from the measurement unit, and operable to produce an error signal; and
a signal processing unit operable to distort the error signal so as to produce a gain control signal which compensates for gain variations occurring in the power amplifier circuit.

2. An RF power amplifier circuit comprising:
a power amplifier having RF signal input and output terminals and a gain control signal input, the power amplifier having a RF gain value determined by a gain control signal received at the gain control signal input; and
a control circuit for providing a gain control signal to the power amplifier, wherein the control circuit comprises:
current measurement means operable to provide a measurement signal indicative of an amount of electrical current drawn by the power amplifier, error detection means operable to produce an error signal in dependence upon the measurement signal and a reference signal; and
processing means having a predetermined distortion block (Hpre) adapted to generate a predetermined distortion, the predetermined distortion block (Hpre) operable to accept the error signal and apply the predetermined distortion to the error signal, the power amplifier, current measurement means, error detection means and processing means forming a feedback loop having a transfer function, the predetermined distortion applied by the predetermined distortion block (Hpre) to the error signal serving to reduce variations in the transfer function of the feedback loop and
to produce a gain control signal which compensates for gain variations occurring in the power amplifier circuit.

3. A method of controlling the output power of a power amplifier circuit, the method comprising:
measuring an electrical current drawn by a power amplifier to obtain a measured current;
producing an error signal in dependence upon the measured current and a reference signal;
generating a predetermined distortion in a predetermined distortion block (Hpre);
supplying the error signal to the predetermined distortion block (Hpre); and
applying the predetermined distortion to the error signal in the predetermined distortion block (Hpre) to produce a gain control signal which compensates for gain variations occurring in the power amplifier circuit.

4. A method as claimed in claim 3, wherein the predetermined distortion is determined as a function of the measured current and the gain control signal.

5. A method as claimed in claim 3 wherein the predetermined distortion is determined from a look up table containing known modification factors.

6. A method as claimed in claim 3, wherein the predetermined distortion of the error signal is determined by a function of the error signal, the measured current and the reference signal.

7. A method as claimed in claim 3, wherein the predetermined distortion is selected by determining the error signal during a first burst of output power from the power amplifier.

8. A method as claimed in claim 3, wherein the predetermined distortion of the error signal is determined by reference to stored values.

9. A power amplifier circuit comprising:
a power amplifier having a control input, a signal input and a signal output, the power amplifier having a gain value determined by a control signal applied to the control input of the power amplifier;
a measurement unit operable to produce a measurement signal indicative of an amount of electrical current drawn by the power amplifier; and
a control unit comprising:
an error detection unit operable to receive the measurement signal from the measurement unit, and operable to produce an error signal; and
a signal processing unit having a predetermined distortion block (Hpre) adapted to generate a predetermined distortion and accept the error signal, the signal processing unit operable to apply the predetermined distortion to the error signal to distort the error signal so as to produce a gain control signal which compensates for gain variations occurring in the power amplifier circuit.

10. The power amplifier circuit of claim 9, wherein the predetermined distortion of the error signal is determined as a function of the measured current and the gain control signal.

11. The power amplifier circuit of claim 9, wherein the predetermined distortion of the error signal is determined from a look up table containing known modification factors.

12. The power amplifier circuit of claim 9, wherein the predetermined distortion of the error signal is determined by a function of the error signal, the measured current and the reference signal.

13. The power amplifier circuit of claim 9, wherein the predetermined distortion of the error signal is determined by reference to stored values.

* * * * *

UNITED STATES PATENT AND TRADEMARK OFFICE
CERTIFICATE OF CORRECTION

PATENT NO. : 7,138,863 B2
APPLICATION NO. : 10/480989
DATED : November 21, 2006
INVENTOR(S) : Persson It is certified that error appears in the above-identified patent and that said Letters Patent is hereby corrected as shown below:

In Fig. 7, Sheet 3 of 3, for Tag 4, below "Gain Control" delete " 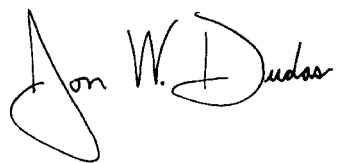 " and insert -- $H_{pre}$ --, therefor.

In Column 3, Line 53, delete "$H^{pre}$" and -- $H_{pre}$ --, therefor.

Signed and Sealed this

Fifth Day of August, 2008

JON W. DUDAS
*Director of the United States Patent and Trademark Office*